(12) United States Patent
Xie et al.

(10) Patent No.: US 10,497,798 B2
(45) Date of Patent: Dec. 3, 2019

(54) VERTICAL FIELD EFFECT TRANSISTOR WITH SELF-ALIGNED CONTACTS

(71) Applicant: GLOBALFOUNDRIES INC., Grand Cayman (KY)

(72) Inventors: Ruilong Xie, Schenectady, NY (US); Steven Bentley, Menands, NY (US); Puneet Harischandra Suvarna, Menands, NY (US); Chanro Park, Clifton Park, NY (US); Min Gyu Sung, Latham, NY (US); Lars Liebmann, Mechanicsville, NY (US); Su Chen Fan, Cohoes, NY (US); Brent Anderson, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/390,232

(22) Filed: Apr. 22, 2019

(65) Prior Publication Data
US 2019/0252267 A1    Aug. 15, 2019

Related U.S. Application Data

(62) Division of application No. 15/705,888, filed on Sep. 15, 2017.

(51) Int. Cl.
| | |
|---|---|
| *H01L 29/66* | (2006.01) |
| *H01L 29/06* | (2006.01) |
| *H01L 29/78* | (2006.01) |
| *H01L 21/8238* | (2006.01) |

(Continued)

(52) U.S. Cl.
CPC ............... *H01L 29/66795* (2013.01); *H01L 21/823431* (2013.01); *H01L 21/823821* (2013.01); *H01L 21/845* (2013.01); *H01L 29/0653* (2013.01); *H01L 29/6656* (2013.01);
(Continued)

(58) Field of Classification Search
CPC ......... H01L 29/66583; H01L 29/66636; H01L 29/0653; H01L 29/66795; H01L 29/6656; H01L 29/7848
See application file for complete search history.

(56) References Cited

U.S. PATENT DOCUMENTS

| | | |
|---|---|---|
| 9,728,466 B1 | 8/2017 | Mallela et al. |
| 2016/0211369 A1 | 7/2016 | Jan et al. |
| 2017/0018551 A1* | 1/2017 | Ponoth ............... H01L 27/0924 |

(Continued)

OTHER PUBLICATIONS

U.S. Appl. No. 15/705,888, Amendment to Office Action filed Oct. 15, 2018, 3 pages.
(Continued)

*Primary Examiner* — Michael Jung
(74) *Attorney, Agent, or Firm* — David Cain; Hoffman Warnick LLC

(57) ABSTRACT

A vertical FinFET includes a semiconductor fin formed over a semiconductor substrate. A self-aligned first source/drain contact is electrically separated from a second source/drain contact by a sidewall spacer that is formed over an endwall of the fin. The sidewall spacer, which comprises a dielectric material, allows the self-aligned first source/drain contact to be located in close proximity to an endwall of the fin and the associated second source/drain contact without risk of an electrical short between the adjacent contacts.

17 Claims, 19 Drawing Sheets

(51) Int. Cl.
*H01L 21/84* (2006.01)
*H01L 21/8234* (2006.01)

(52) U.S. Cl.
CPC .. *H01L 29/66583* (2013.01); *H01L 29/66636* (2013.01); *H01L 29/7848* (2013.01)

(56) References Cited

U.S. PATENT DOCUMENTS

2017/0278943 A1    9/2017  Balakrishnan et al.
2018/0323298 A1*  11/2018  Dasgupta ............ H01L 29/7788

OTHER PUBLICATIONS

U.S. Appl. No. 15/705,888, Amendment to Office Action filed Feb. 12, 2019, 10 pages.
U.S. Appl. No. 15/705,888, Notice of Allowance dated Mar. 20, 2019, 11 pages.

* cited by examiner

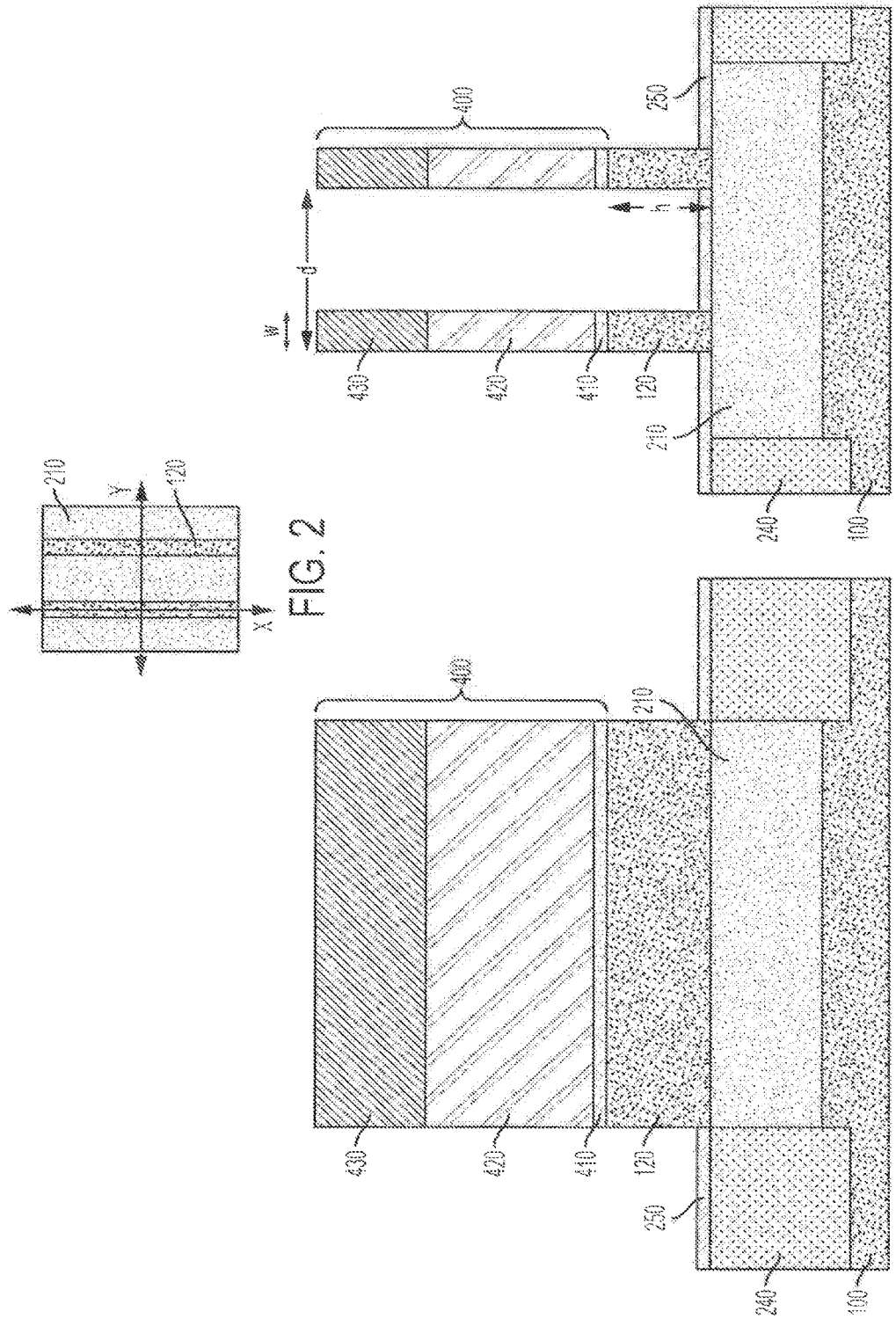

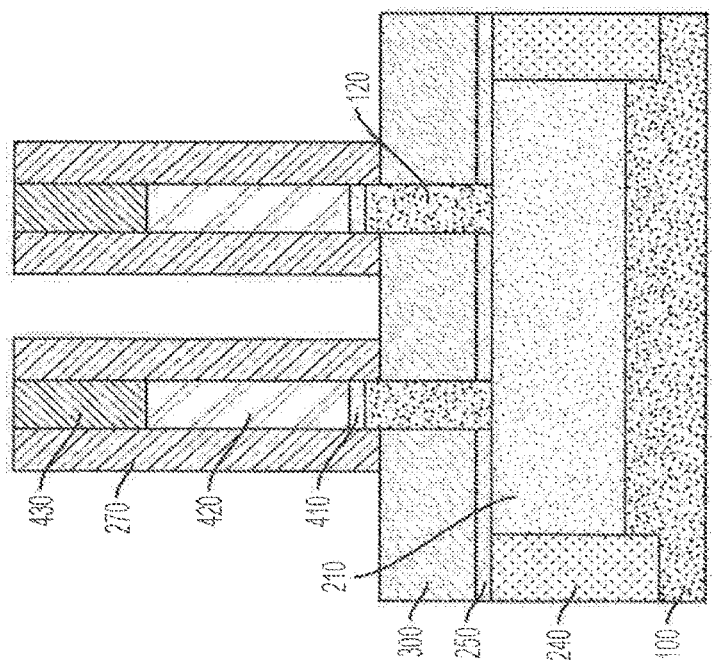
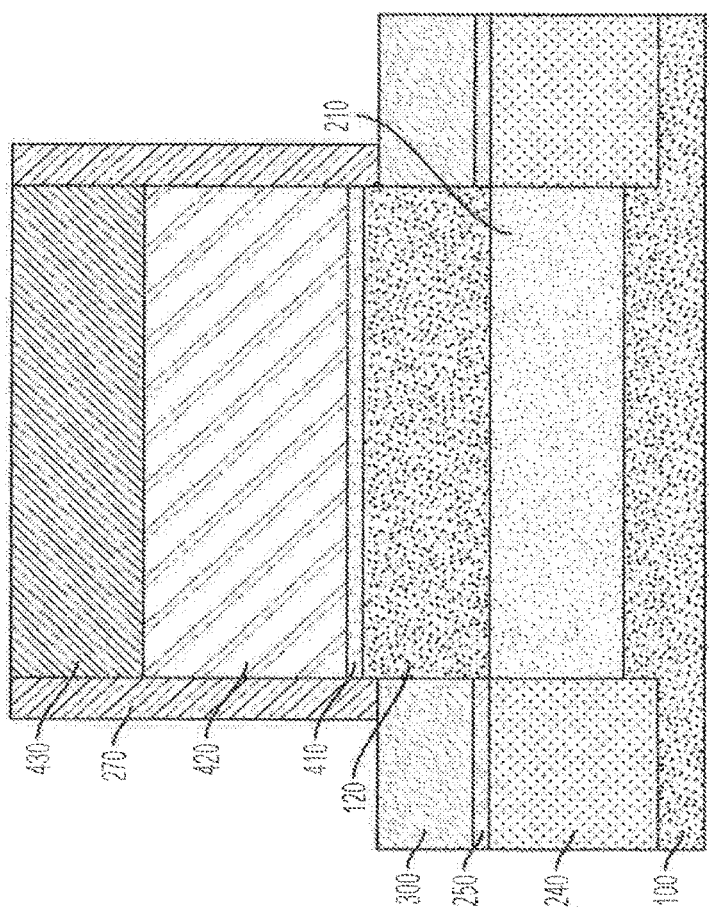

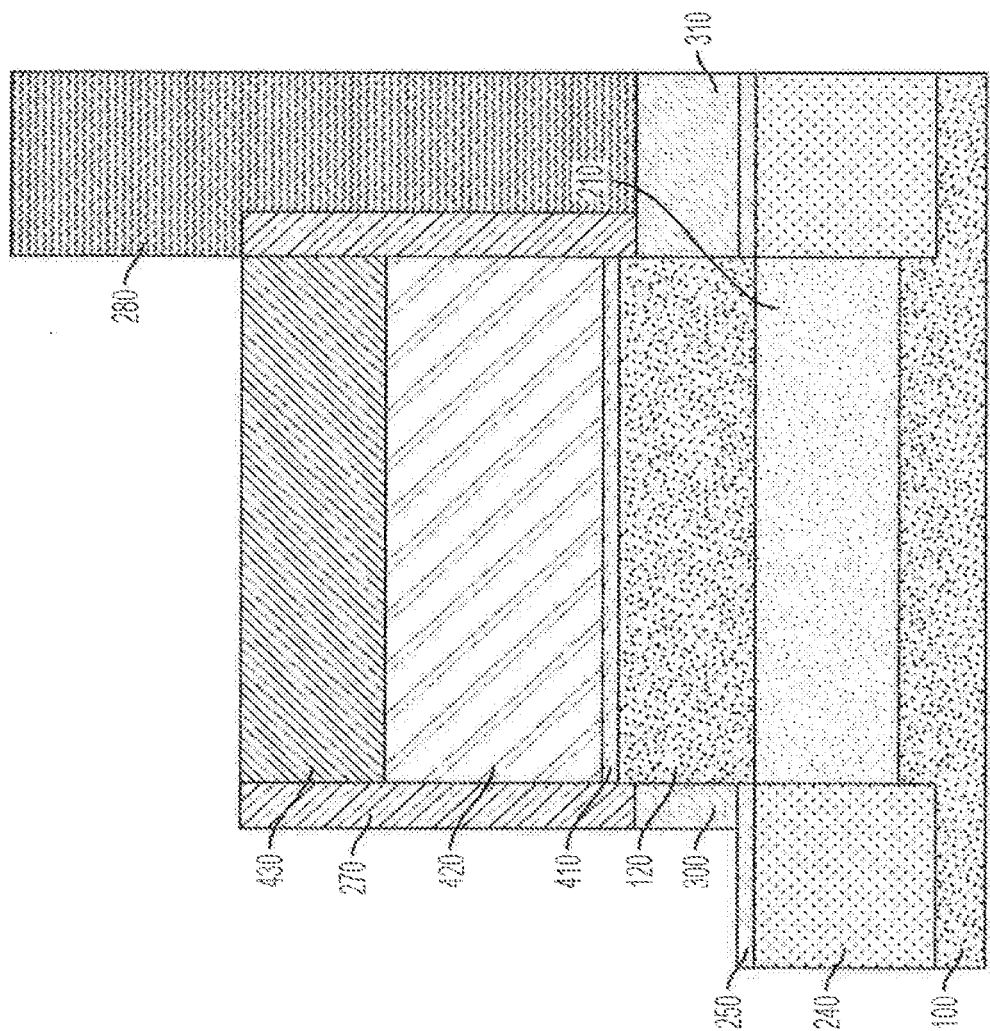
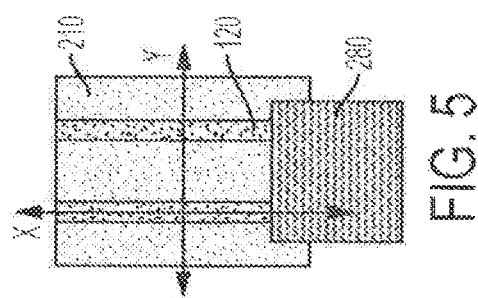

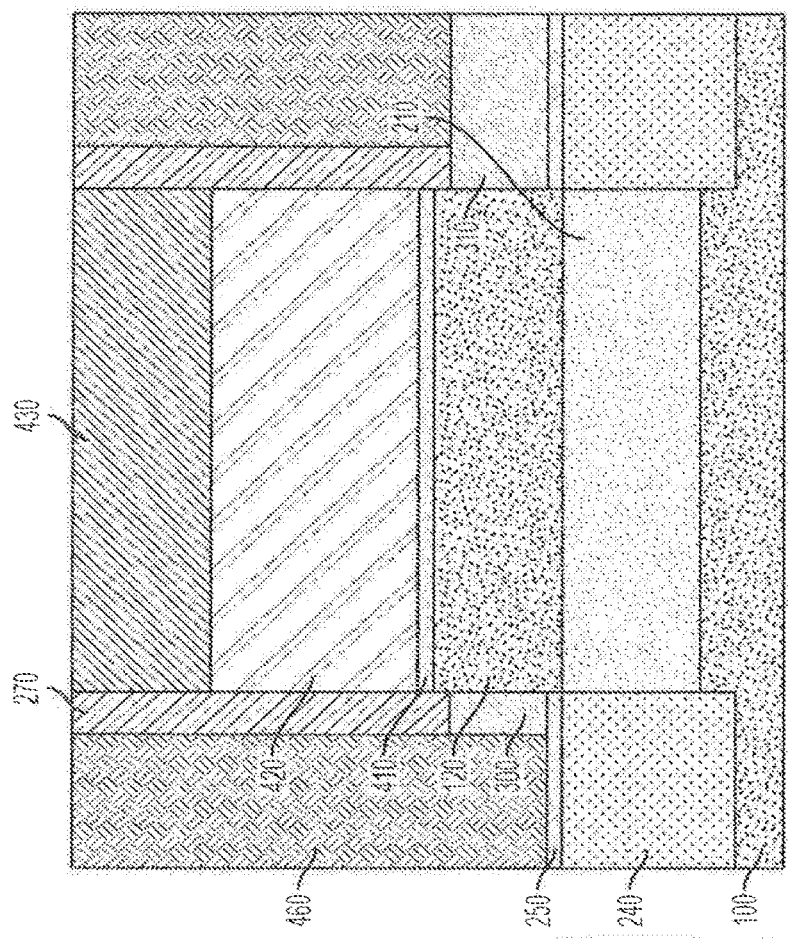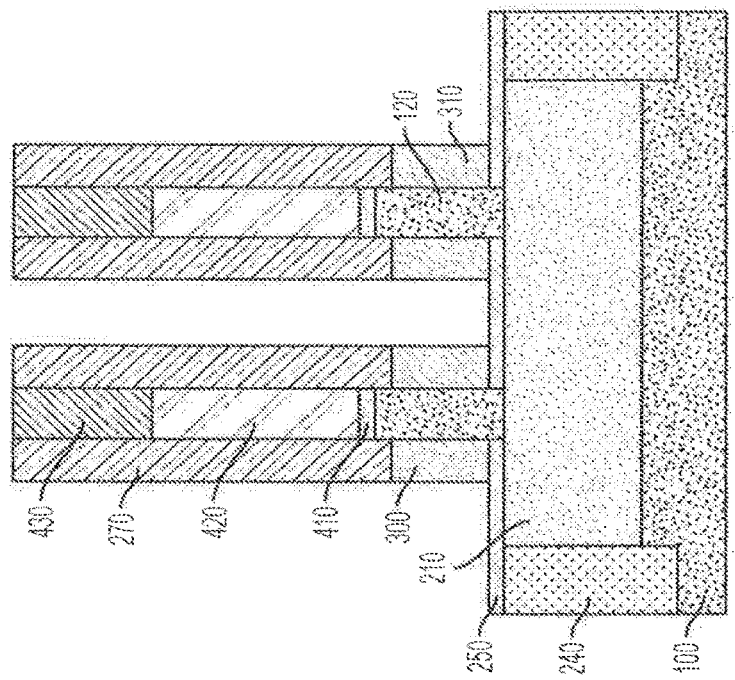

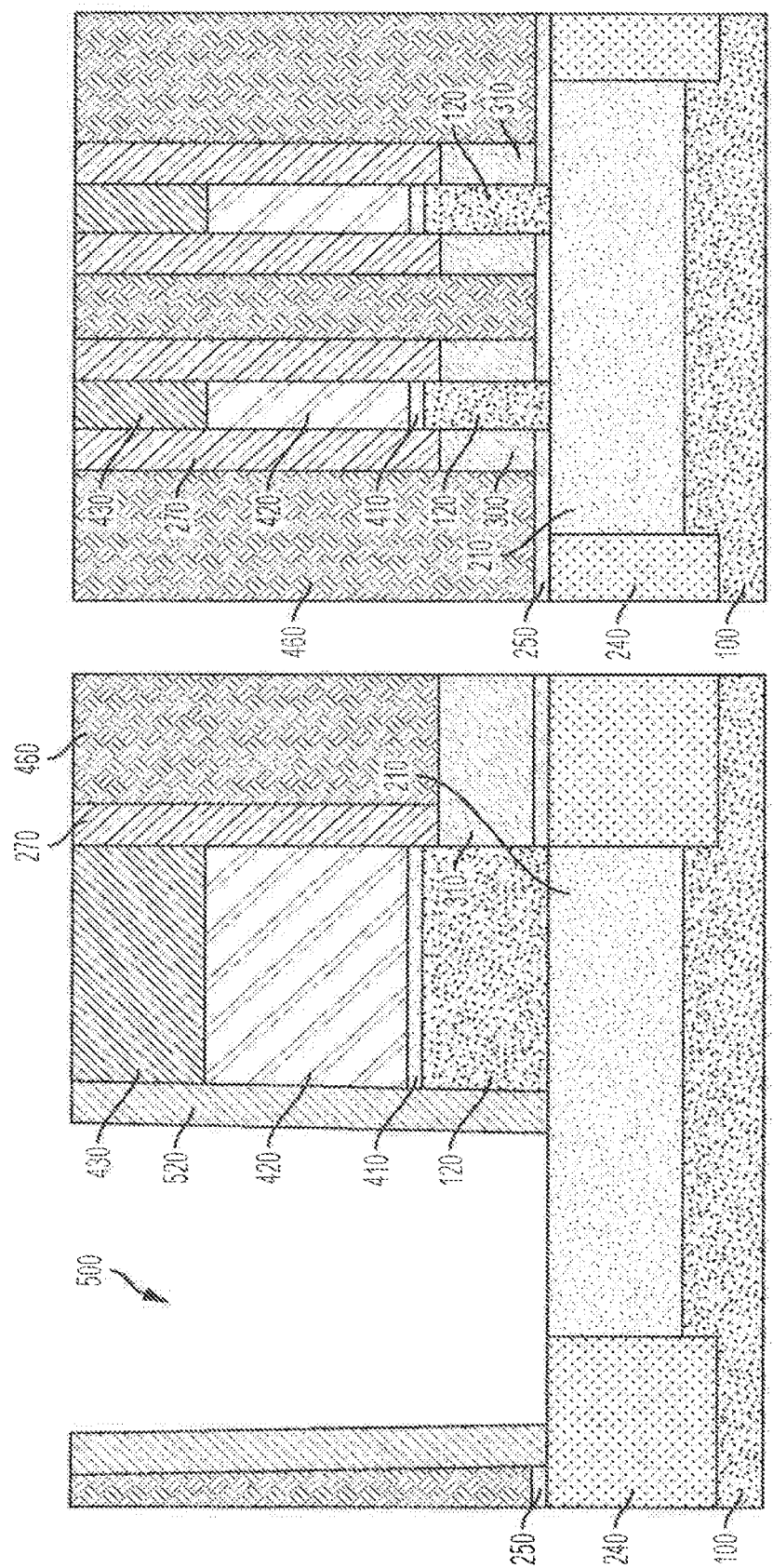

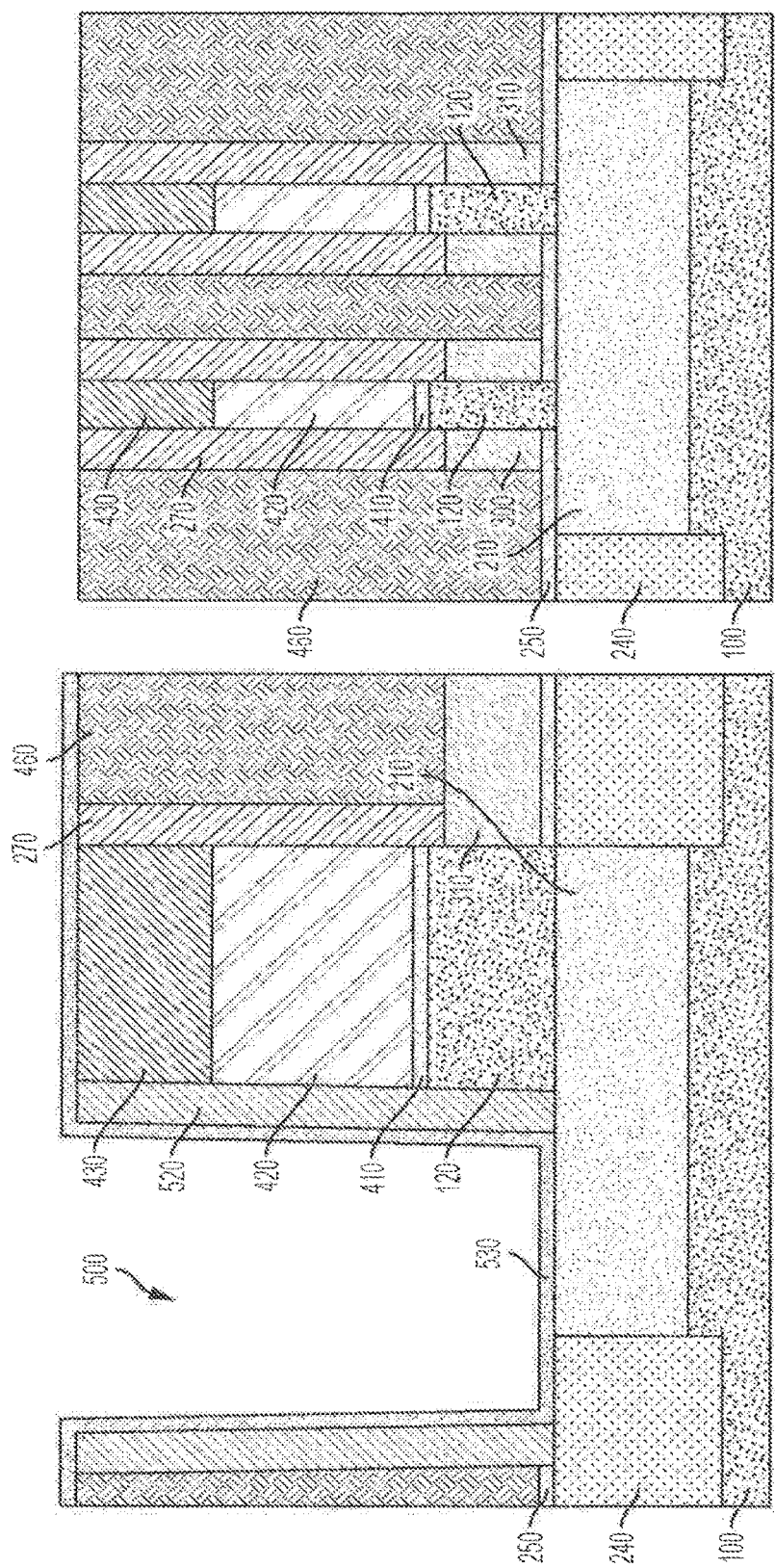

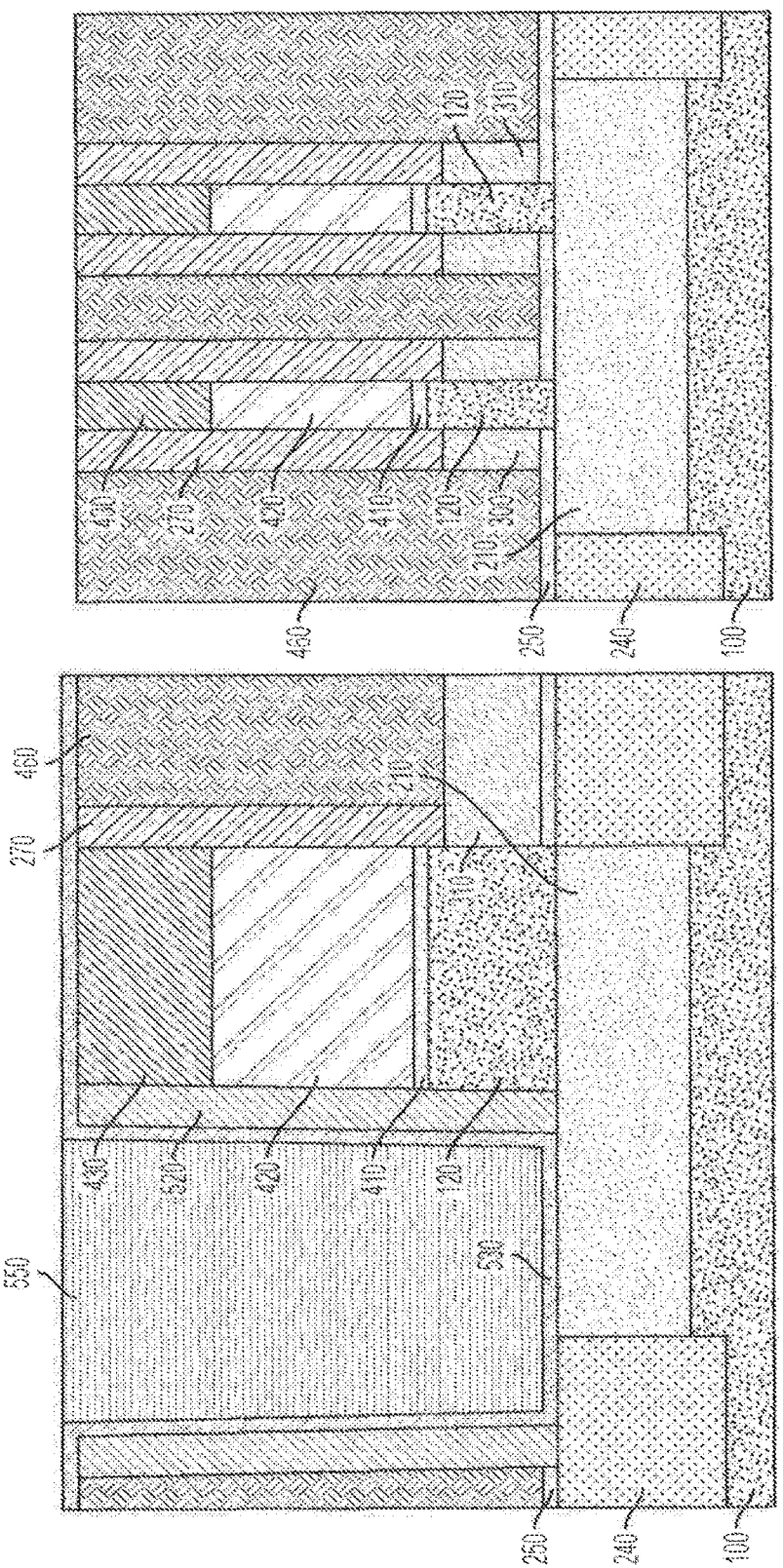

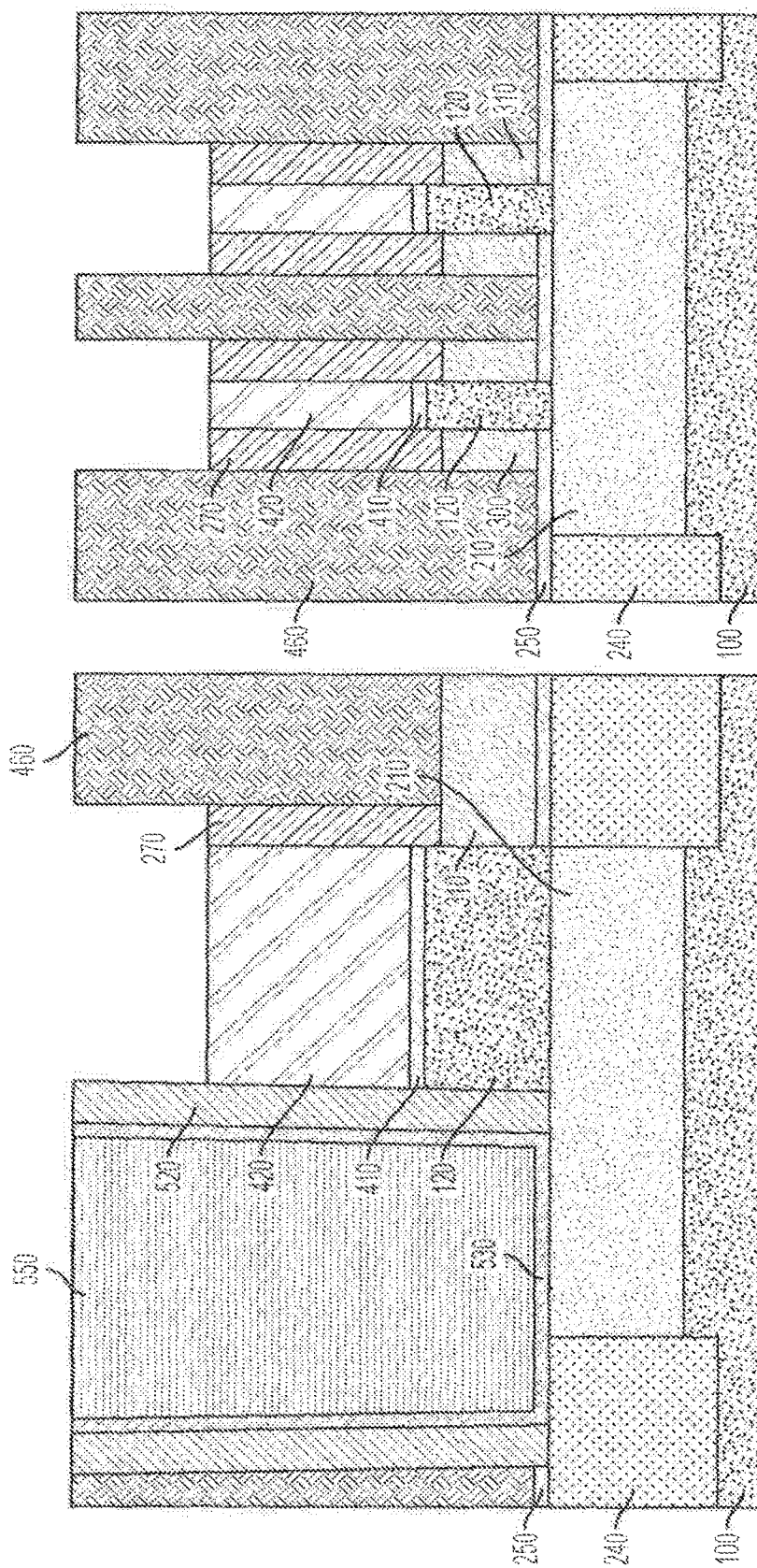

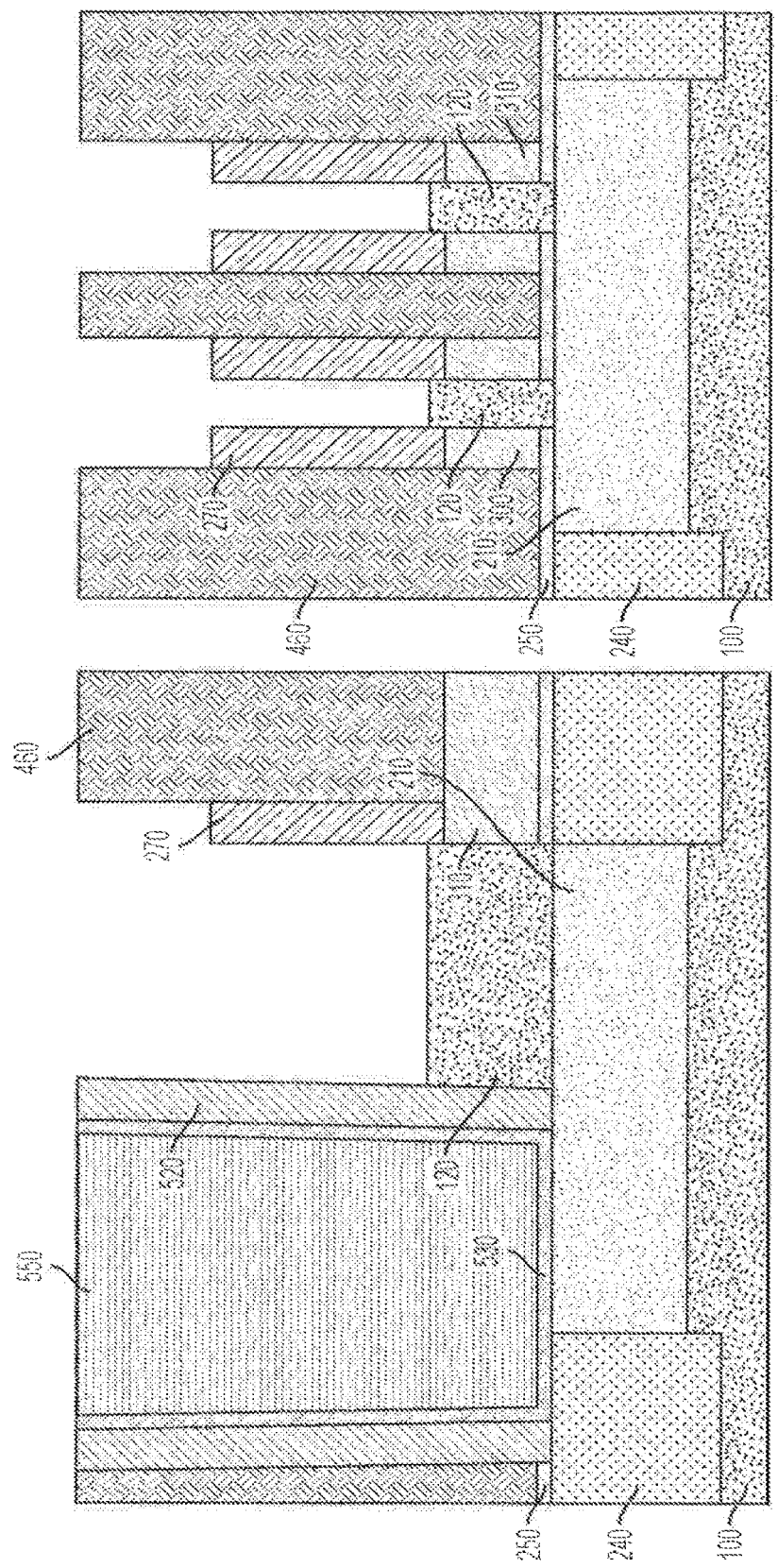

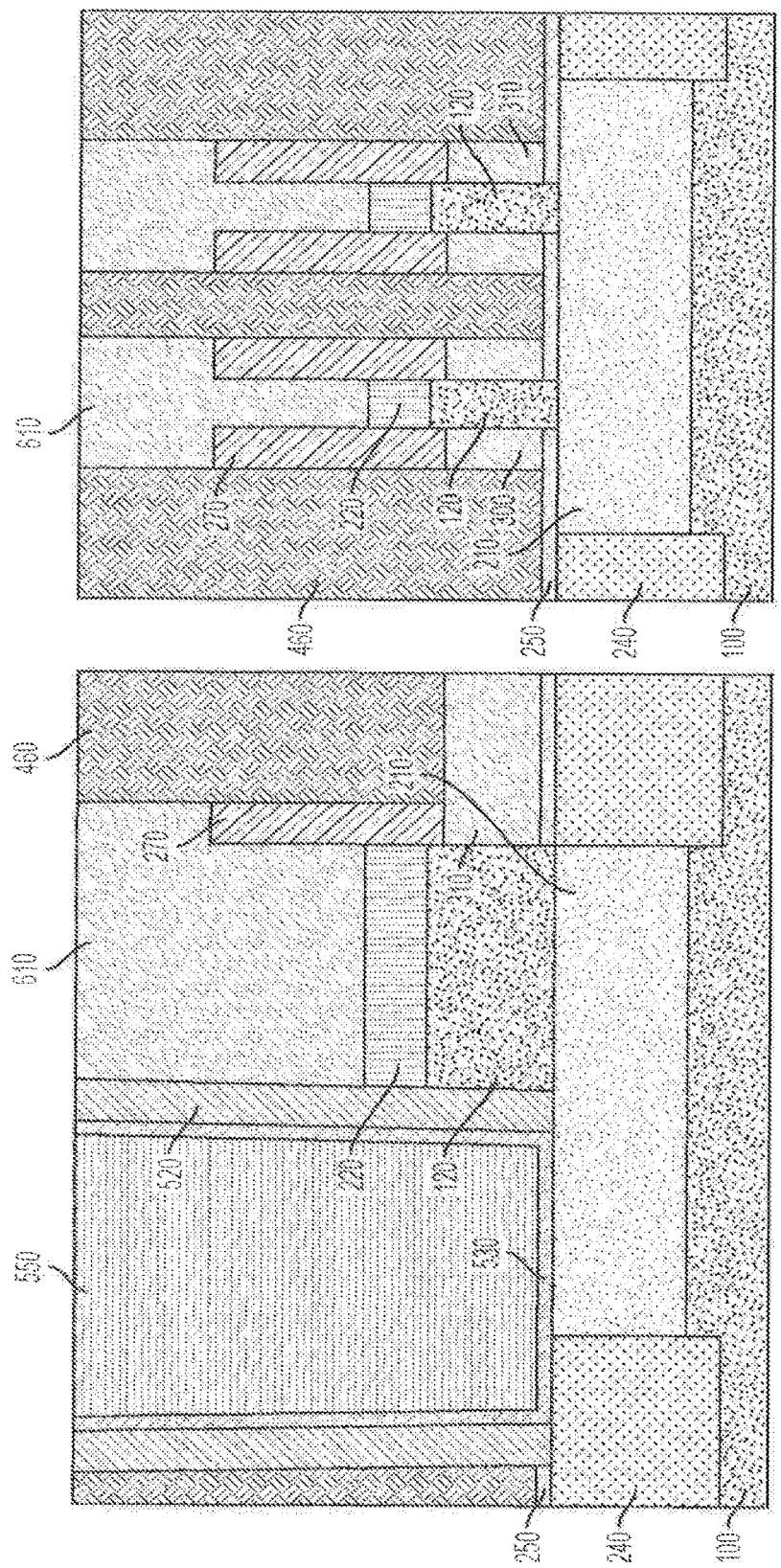

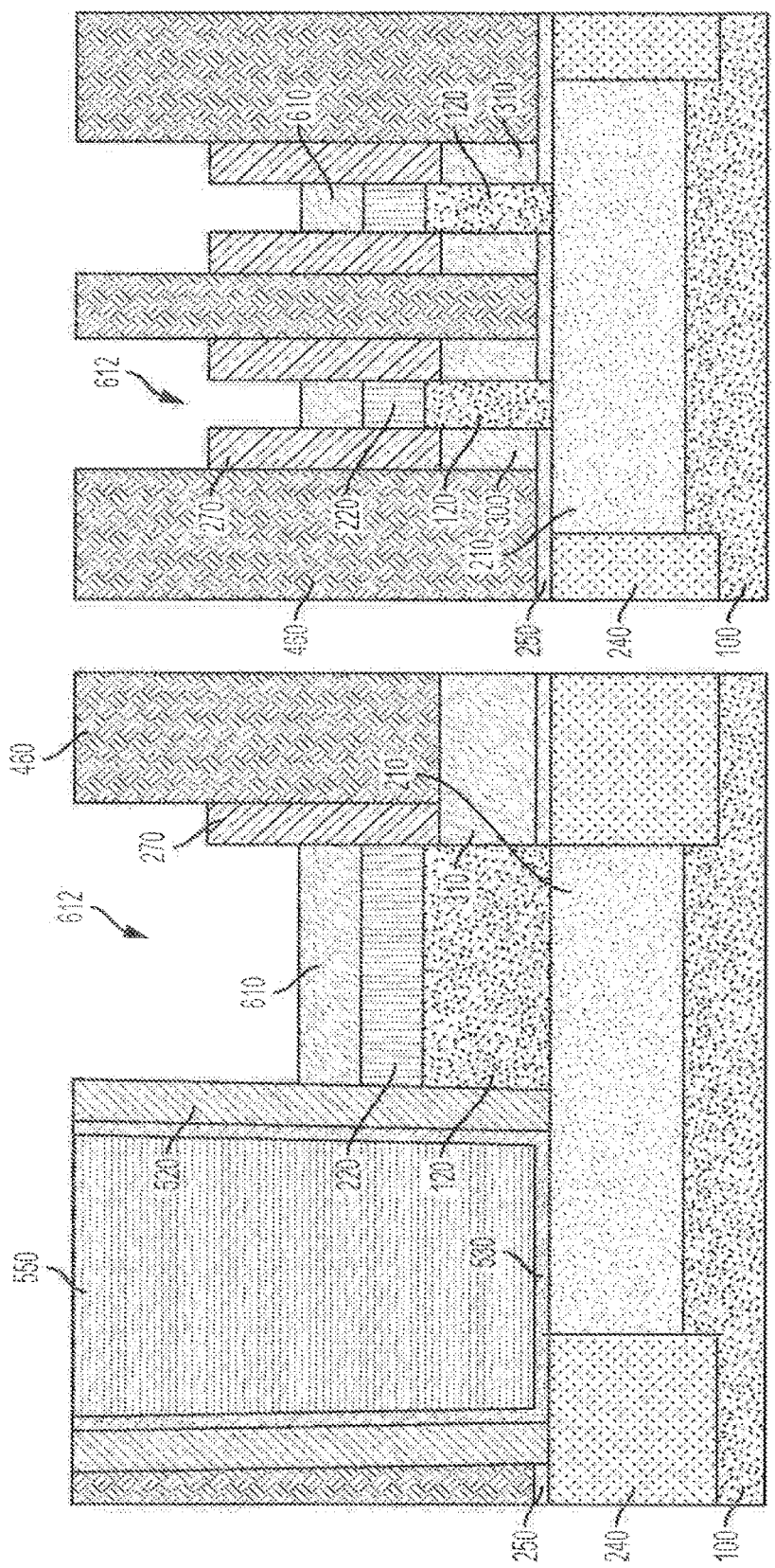

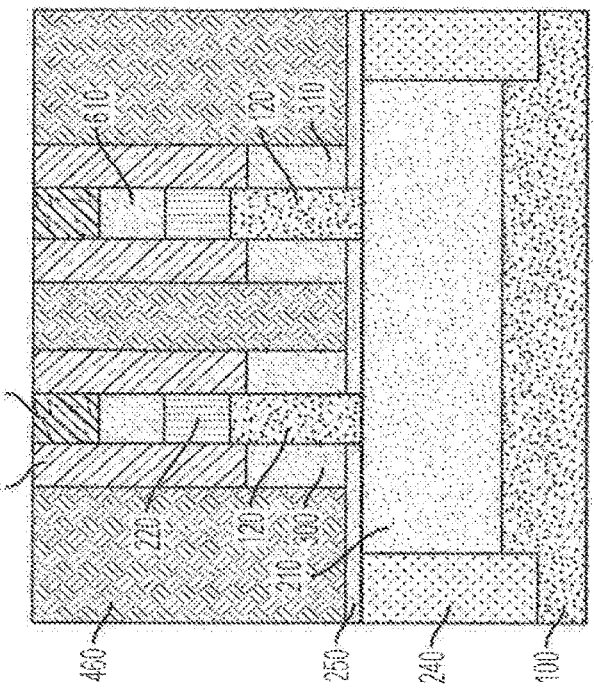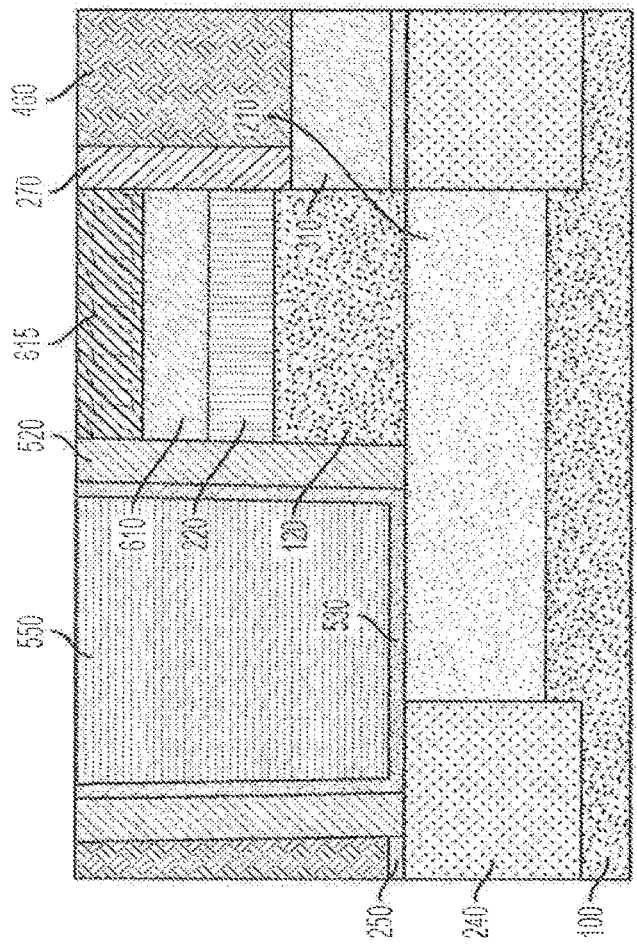
FIG. 15A
FIG. 15B

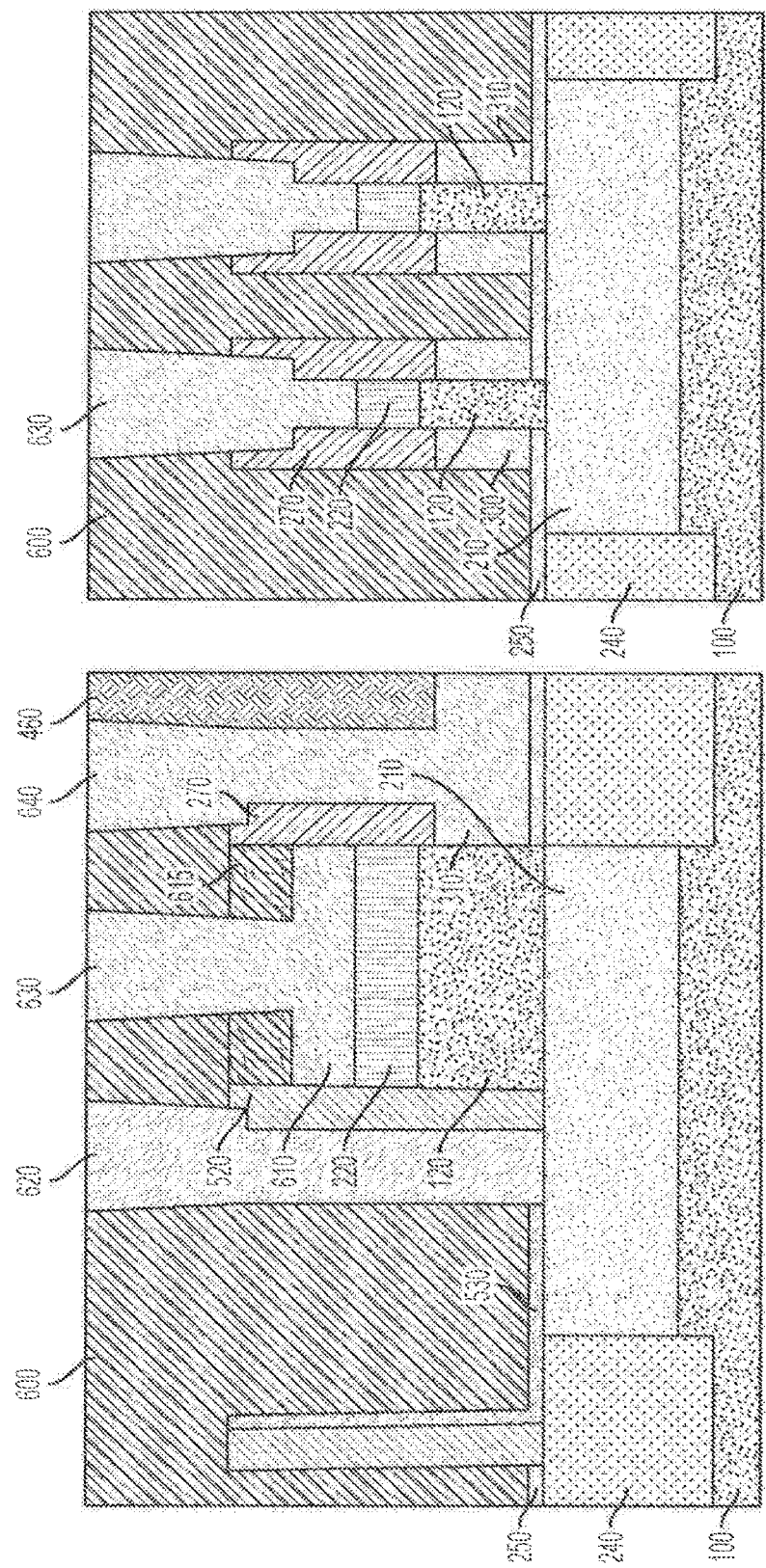

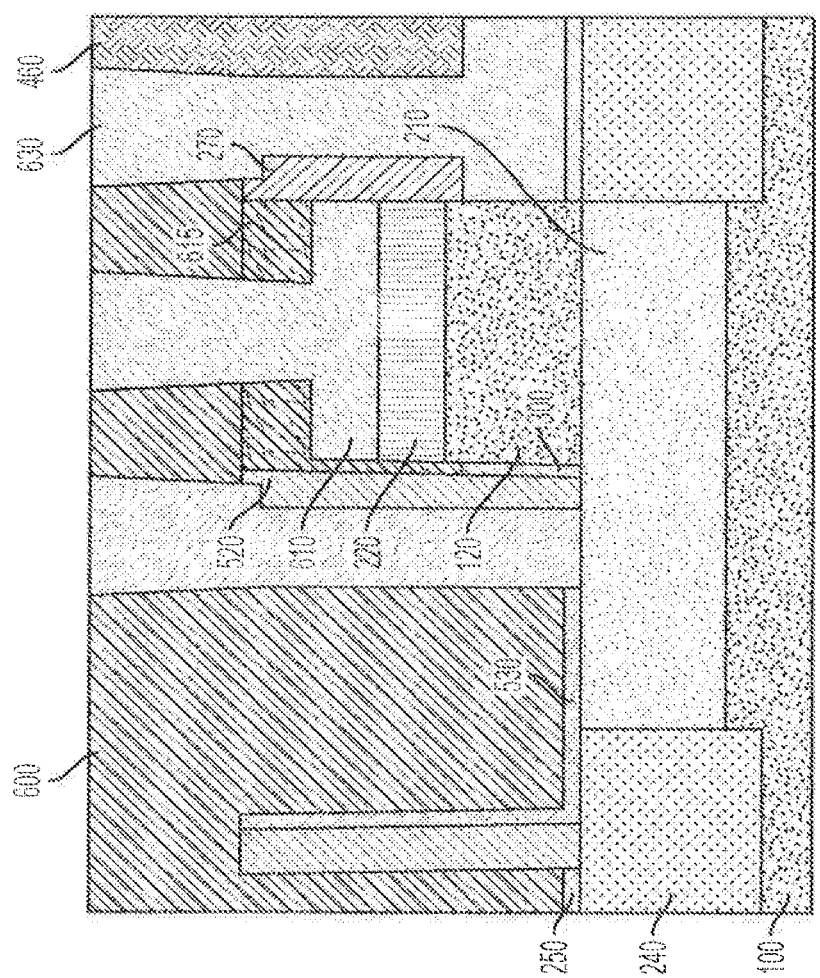

VERTICAL FIELD EFFECT TRANSISTOR WITH SELF-ALIGNED CONTACTS

CROSS-REFERENCE TO RELATED APPLICATIONS

This application is a divisional of U.S. application Ser. No. 15/705,888 filed on Sep. 15, 2017, now issued as U.S. Pat. No. 10,312,154, hereby incorporated by reference in its entirety.

BACKGROUND

The present application relates generally to semiconductor devices, and more specifically to vertical field effect transistors (VFETs) and their methods of production.

Vertical field effect transistors such as vertical fin FETs are devices where the source-drain current flows from a source region to a drain region through a channel region of a semiconductor fin in a direction normal to a substrate surface. An advantage of the vertical FET is its decreased footprint, which may beneficially impact device scaling relative to alternate geometries. In vertical fin field effect transistor (FinFET) devices, the fin defines the transistor channel with the source and drain regions located at opposing (i.e., upper and lower) ends of the fin.

Aggressive scaling of semiconductor devices and the attendant decrease in critical dimension (CD) poses a number of challenges, including the creation of parasitic capacitance or short circuits between adjacent conductive elements due to a decreased spacing therebetween. Accordingly, it would be beneficial to provide methods for manufacturing advanced node vertical FinFET devices having a reduced footprint without adversely affecting device performance and reliability.

SUMMARY

In a method of forming a vertical FinFET, the formation of a semiconductor fin, a bottom source/drain region over a lower portion of the fin, and a gate stack over sidewalls of the fin (i.e., above the bottom source/drain region) precedes a fin cut that defines an active region of the device. The fin cut exposes the bottom source/drain region, and a sidewall spacer is formed within the cut region. The sidewall spacer is formed over, and may be formed directly over the cut end of the fin.

The cut region is backfilled with a dielectric layer, and a top source/drain region, metallization layer, and dielectric capping layer are formed over remaining portions of the fin adjacent to the backfilled cut region. A self-aligned contact through the dielectric layer to the bottom source/drain region is formed laterally spaced from the top source/drain region and the metallization layer. The sidewall spacer isolates this self-aligned bottom source/drain contact from the top source/drain contact, which allows the bottom source/drain contact to be located in close proximity to the cut end of the fin. The method also provides for the formation of a self-aligned gate contact, which may be formed adjacent to the uncut end of the fin.

In accordance with embodiments of the present application, a method of forming a vertical FinFET includes forming a hard mask over a semiconductor substrate, forming a fin over the semiconductor substrate using the hard mask as an etch mask, and forming a bottom source/drain region over the semiconductor substrate, where a lower portion of the fin is in contact with the bottom source/drain region.

A gate stack is formed over sidewalls of the fin such that the gate stack extends laterally over the bottom source/drain region on at least one side of the fin, and includes a gate dielectric formed over the fin and a gate conductor formed over the gate dielectric.

The method further comprises etching an opening in the hard mask and through a portion of the fin to expose an endwall of the fin and a top surface of the bottom source/drain region laterally adjacent to the endwall. A sidewall spacer is formed within the opening, where the sidewall spacer is formed over the exposed endwall of the fin. A top source/drain region is formed over an upper portion of the fin and a top source/drain metallization layer is formed over the top source/drain region. A bottom source/drain metallization layer is formed over the bottom source drain region, where the top source/drain metallization layer is formed over a first side of the sidewall spacer and the bottom source/drain metallization layer is formed over a second side of the sidewall spacer opposite to the first side.

According to further embodiments, a vertical FinFET device may be formed by etching an opening in a hard mask disposed over a semiconductor fin and through a portion of the fin to expose an endwall of the fin endwall and a top surface of a bottom source/drain region disposed laterally adjacent to the endwall. A sidewall spacer is then formed within the opening, where the sidewall spacer is formed over the exposed endwall of the fin.

A top source/drain region is formed over an upper portion of the fin and a top source/drain metallization layer is formed over the top source/drain region. The method further includes forming a bottom source/drain metallization layer over the bottom source drain region within the opening, wherein the sidewall spacer is disposed between the top source/drain metallization layer and the bottom source/drain metallization layer.

An example vertical FinFET device includes a fin disposed over a semiconductor substrate, and a bottom source/drain region disposed over the semiconductor substrate, where a lower portion of the fin is in contact with the bottom source/drain region. The device further includes a gate stack disposed over sidewalls of the fin, where the gate stack extends laterally over the bottom source/drain region on at least one side of the fin, a top source/drain region disposed over an upper portion of the fin, and a top source/drain metallization layer in electrical contact with the top source/drain region.

A bottom source/drain metallization layer is in electrical contact with the bottom source/drain region, and a spacer layer is disposed over an endwall of the fin, where the spacer layer is disposed between the top source/drain metallization layer and the bottom source/drain metallization layer.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIG. 2 is a top down view of a vertical fin field effect transistor architecture showing a pair of parallel fins and an associated bottom source/drain region;

FIG. 2A is a cross-sectional view of FIG. 2 along the line X-X parallel to one of the fins following formation of the bottom source/drain region and a bottom spacer layer;

FIG. 2B is a cross-sectional view of FIG. 2 along the line Y-Y perpendicular to the fins;

FIG. 4A depicts the formation of a top spacer layer over a fin and over the gate stack proximate to the fin;

FIG. 4B depicts the formation of a top spacer layer over adjacent parallel fins;

FIG. 5 is a top down plan view of a vertical fin field effect transistor architecture showing the location of a gate contact;

FIG. 5A is a cross-sectional view of FIG. 5 along the line X-X parallel to one of the fins showing patterning of an etch mask to define a gate contact location;

FIG. 5B is a cross-sectional view of FIG. 5 along the line Y-Y perpendicular to the fins showing a pair of parallel fins, a cut gate stack, the bottom spacer layer, and the top spacer layer;

FIG. 6A is a cross-sectional view parallel to a fin following deposition and planarization of an interlayer dielectric;

FIG. 8A shows the formation of a sidewall spacer within the fin cut opening;

FIG. 8B is a cross-sectional view taken between the fin cut opening and the gate contact location;

FIG. 9A shows the formation of a liner over the sidewall spacer within the fin cut opening of FIG. 8A;

FIG. 9B is a cross-sectional view taken between the fin cut opening and the gate contact location;

FIG. 10A depicts the deposition, planarization and densification of an interlayer oxide directly over the liner and within the fin cut opening of FIG. 9A;

FIG. 10B is a cross-sectional view taken between the fin cut opening and the gate contact location;

FIG. 11A shows etching of the top spacer layer and a nitride layer to expose a top surface of an amorphous silicon layer over the fin;

FIG. 11B shows a recess etch of the top spacer layer;

FIG. 12A depicts removal of the amorphous silicon layer and a dielectric layer from over the fin;

FIG. 12B shows exposure of the fin top surfaces following removal of the amorphous silicon layer and the dielectric layer;

FIG. 13A depicts formation of a top source/drain region over the fin and the formation of contact metallization in electrical contact with the top source/drain region;

FIG. 13B depicts formation of a top source/drain region over the fins and the formation of contact metallization to the top source/drain regions;

FIG. 14A shows a recess etch of the contact metallization over the top source/drain region;

FIG. 14B shows a selective etch of the contact metallization over the top source/drain region;

FIG. 15A shows the formation of a self-aligned capping layer over the recessed contact metallization;

FIG. 15B shows the formation of a self-aligned capping layer over the recessed contact metallization;

FIG. 16A depicts contact formation to each of the bottom source/drain region, top source/drain region and gate;

FIG. 16B shows the formation of conductive contacts to the top source/drain regions according to various embodiments; and FIG. 17A shows the retention of a layer of gate metallization over the end sidewall of a fin prior to the formation of self-aligned contacts to the bottom source/drain region, top source/drain region and gate.

DETAILED DESCRIPTION

Figure 1:
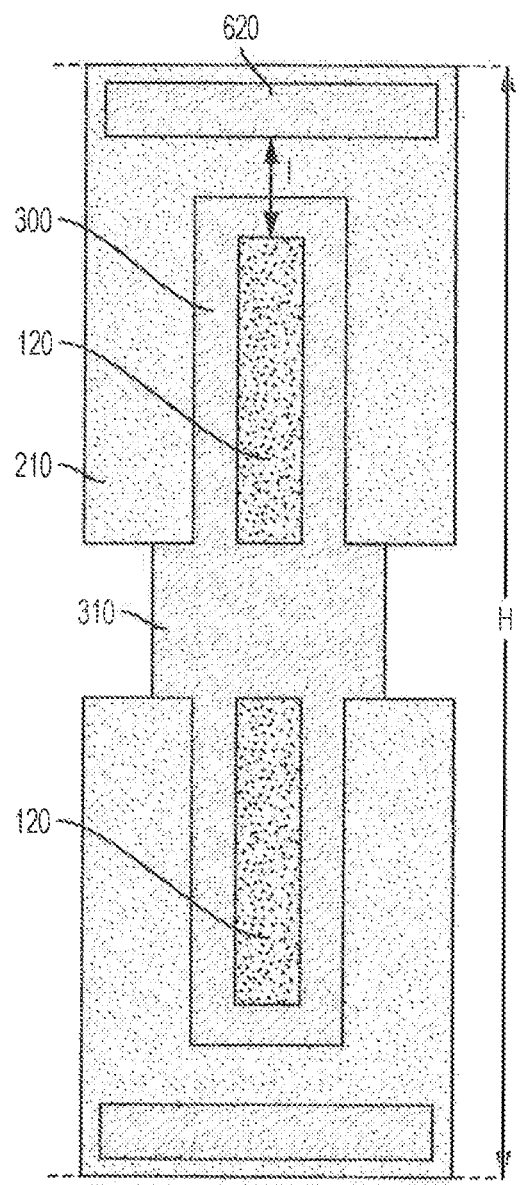
FIG. 1 is a schematic top down view of a vertical fin field effect transistor (VFinFET) showing the spatial relationship between bottom source/drain and gate metallization layers.

Reference will now be made in greater detail to various embodiments of the subject matter of the present application, some embodiments of which are illustrated in the accompanying drawings. The same reference numerals will be used throughout the drawings to refer to the same or similar parts.

Referring to FIG. 1, a typical vertical FinFET device includes a pair of fins 120 each laterally surrounded by a gate stack 300. The gate stack 300 includes a gate dielectric formed over portions of the sidewalls of the fins and a gate conductor formed over the gate dielectric. For clarity, the gate dielectric and the gate conductor are not separately shown. As used herein "lateral" refers to a direction parallel to a major surface of a substrate.

A wider region of the gate conductor layer between the fins 120 provides a gate contact location 310. A bottom source/drain region 210 is formed over a lower portion of each of the fins 120, i.e., below the gate stack 300, and a bottom source/drain contact 620 provides electrical contact to the bottom source/drain region 210.

In certain structures, one of the two illustrated fins 120 may define a p-MOS device, while the second fin defines an n-MOS device, where the overall height (H) of the complementary (CMOS) cell is measured parallel to a length direction of the fins from one bottom source/drain contact to the other.

Referring still to FIG. 1, in a conventional layout, to avoid a short circuit between the bottom source/drain contact 620 and the gate, the distance (l) from a source/drain contact 620 to the adjacent fin 120 may be greater than about 25 nm. In order to minimize the likelihood of a short circuit between adjacent conductive elements, a minimum distance (l) is incorporated into the design, for example, to account for variability in the placement of each of the source/drain contact 620 and the gate stack 300 over the fin end, which significantly impacts the overall cell height (H) and is adverse to further cell height scaling.

As will be appreciated, using the manufacturing approach disclosed herein, the source/drain contact-to-fin spacing (l) can be scaled to 10 nm or less, e.g., 4, 6, 8 or 10 nm, which improves manufacturability and yield. That is, the disclosed method and resulting structure provide for the source/drain contact 620 to be located closer to the associated fin 120 than is achievable with conventional manufacturing by incorporating a barrier layer between the source/drain contact and the fin. Moreover, in certain embodiments, a portion of the total cell height (H) that is decreased by decreasing the source/drain contact-to-fin spacing (l) can be reallocated to the length of one or more fins, which may beneficially increase the effective gate length of the device. A method of forming such a structure is described herein with reference to FIGS. 2-17.

Referring to FIG. 2, a schematic top-down layout of an exemplary vertical FinFET includes a pair of fins 120 and a bottom source/drain region 210 formed over lower portions of the fins adjacent to a semiconductor substrate. Cross-sectional views through one of the fins 120 along the line X-X, and transverse to the fins 120 along the line Y-Y are shown in FIGS. 2A and 2B, respectively.

In the cross-sectional views of FIGS. 2A and 2B, shown is an epitaxial bottom source/drain region 210 disposed over a lower portion of the pair of fins 120, which are formed over a semiconductor substrate 100. A composite hard mask 400 is disposed over the fins, and a bottom spacer layer 250 is formed over the substrate 100 and between the fins.

The substrate 100 may include a semiconductor material such as silicon (Si), e.g., single crystal Si or polycrystalline Si, or a silicon-containing material. Silicon-containing materials include, but are not limited to, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire solid is substantially continuous and substantially unbroken to the edges of the solid with substantially no grain boundaries.

The substrate 100 is not limited to silicon-containing materials, however, as the substrate 100 may comprise other semiconductor materials, including Ge and compound semiconductors, including III-V compound semiconductors such as GaAs, InAs, GaN, GaP, InSb, ZnSe, and ZnS, and II-VI compound semiconductors such as CdSe, CdS, CdTe, ZnSe, ZnS and ZnTe.

Semiconductor substrate 100 may be a bulk substrate or a composite substrate such as a semiconductor-on-insulator (SOI) substrate that comprises, from bottom to top, a handle portion, an isolation layer (e.g., buried oxide layer) and a semiconductor material layer. In the illustrated embodiment, only the topmost semiconductor material layer of such a substrate is shown.

Substrate 100 may have dimensions as typically used in the art and may comprise, for example, a semiconductor wafer. Example wafer diameters include, but are not limited to, 50, 100, 150, 200, 300 and 450 mm. The total substrate thickness may range from 250 microns to 1500 microns, although in particular embodiments the substrate thickness is in the range of 725 to 775 microns, which corresponds to thickness dimensions commonly used in silicon CMOS processing. The semiconductor substrate 100 may comprise (100)-oriented silicon or (111)-oriented silicon, for example.

As will be appreciated by those skilled in the art, semiconductor fins 120 may be defined by a patterning process such as photolithography, which includes forming a hard mask 400 over the substrate 100 and forming a layer of photoresist material (not shown) atop the hard mask 400. The photoresist material may include a positive-tone photoresist composition, a negative-tone photoresist composition, or a hybrid-tone photoresist composition. A layer of photoresist material may be formed by a deposition process such as, for example, spin-on coating.

Hard mask 400 may include a material such as, for example, silicon nitride or silicon oxynitride, and may be deposited using conventional deposition processes, such as, for example, CVD or plasma-enhanced CVD (PECVD). By way of example, in the illustrated embodiment, hard mask 400 includes a stack comprising, from bottom to top, a layer of silicon dioxide 410, a layer of amorphous silicon 420, and a layer of silicon nitride 430. According to various embodiments, the thickness of the silicon dioxide layer 410 may be 2 to 5 nm, the thickness of the amorphous silicon layer 420 may be 30 to 50 nm, and the thickness of the silicon nitride layer 430 may be 20 to 40 nm.

The deposited photoresist is then subjected to a pattern of irradiation, and the exposed photoresist material is developed utilizing a conventional resist developer. The pattern provided by the patterned photoresist material is thereafter transferred into the hard mask 400 and then into the substrate 100 utilizing at least one pattern transfer etching process.

The pattern transfer may be achieved by at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. In several embodiments, the fins 120 are etched from, and therefore contiguous with the semiconductor substrate 100.

In other embodiments, the fin formation process may include a sidewall image transfer (SIT) process or a double patterning (DP) process. The SIT process includes forming a mandrel material layer (not shown) atop the material or material layers (i.e., crystalline silicon) that is to be patterned. The mandrel material layer can include any material (semiconductor, dielectric or conductive) that can be selectively removed from the structure during a subsequently performed etch.

As used herein, the terms "selective" or "selectively" in reference to a material removal or etch process denote that the rate of material removal for a first material is greater than the rate of re ova for at least another material of the structure to which the material removal process is applied. For example, in certain embodiments, a selective etch may include an etch chemistry that removes a first material selectively to a second material by a ratio of 2:1 or greater, 5:1, 10:1 or 20:1.

For instance, the mandrel material layer may be composed of amorphous silicon or polysilicon. Alternatively, the mandrel material layer may be composed of a metal such as, for example, Al, W, or Cu. The mandrel material layer can be formed, for example, by chemical vapor deposition or plasma enhanced chemical vapor deposition. Following deposition of the mandrel material layer, the mandrel material layer can be patterned by lithography and etching to form a plurality of mandrel structures (also not shown) on the topmost surface of the structure.

The SIT process continues by forming a dielectric spacer on opposing sidewalls of each mandrel structure. The dielectric spacer can be formed by deposition of a dielectric spacer material and etching of the dielectric spacer material. The dielectric spacer material may comprise any dielectric material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that can be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the pattern provided by the dielectric spacers is transferred into the underlying material or material layers, including substrate 100 to form semiconductor fins 120.

Each of the fins 120 may have a height (h) ranging from 5 nm to 100 nm, e.g., 10, 20, 50, or 100 nm, including ranges between any of the foregoing values, and width (w) of less than 20 nm, e.g., 3, 5, 8, 10, 12 or 15 nm, including ranges between any of the foregoing values. The fins may be characterized by two pairs of opposing sidewalls where, as used herein, the sidewalls that extend parallel to the fin width are referred to as endwalls. As illustrated in FIG. 2B the pitch (d), i.e., repeat distance, between adjacent fins 120 may range from 10 nm to 60 nm, e.g., 10, 20, 30, 40, 50 or 60 nm, including ranges between any of the foregoing values. Although two fin 120 are shown in the FIG. 2B cross-section, the present disclosure is not limited to only this example. It is noted that any number of fins 120 may be formed from the semiconductor substrate 100. After bulk fin formation, a fin cut or fin removal process may be used to remove unwanted fin structures from the particular circuit or device being fabricated.

FIGS. 2A and 2B also show the formation of epitaxial source/drain regions 210 over the fins 120. Bottom source/drain regions 210 may be formed by selective epitaxial growth from fin 120 or by ion implantation. The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. For example, an epitaxial semiconductor material deposited on a (100) crystal surface will take on a (100) orientation. Top source/drain regions 700 may comprise silicon, silicon germanium, or another suitable semiconductor material.

Example epitaxial growth processes include low energy plasma deposition, liquid phase epitaxy, molecular beam epitaxy, and atmospheric pressure chemical vapor deposition. An example silicon epitaxial process for forming top source (or drain) region uses a gas mixture including $H_2$ and silane ($SiH_4$) or dichlorosilane ($SiH_2Cl_2$) at a deposition (e.g., substrate) temperature of 450-800° C. and a growth pressure (i.e., chamber pressure) of 0.1-700 Torr.

The foregoing process may be modified to form a silicon germanium ($SiGe_x$) epitaxial source/drain region. During such a process, a germanium source such as germane gas ($GeH_4$) flows concurrently into a process chamber with a silicon source and a carrier gas (e.g., $H_2$ and/or $N_2$). By way of example, the flow rate of the silicon source may be in the range of 5 sccm to 500 sccm, the flow rate of the germanium source may be in the range of 0.1 sccm to 10 sccm, and the flow rate of the carrier gas may be in the range of 1,000 sccm to 60,000 sccm, although lesser and greater flow rates may be used. By way of example, the germanium content of a silicon germanium ($SiGe_x$) source/drain region 210 may be in the range of 25 to 50 atomic percent. A bottom source/drain region is formed over a lower portion of each fin 120, i.e., proximate to substrate 100.

Referring still to FIGS. 2A and 2B, isolation regions 240 such as shallow trench isolation (STI) regions may be formed in substrate 100, i.e., between fins, by etching regions of the substrate to form trenches that are back-filled with a dielectric layer. For instance, isolation regions 240 may comprise an oxide such as silicon dioxide.

A bottom spacer layer 250 is then formed over the shallow trench isolation 240 and over a top surface of the substrate 100, including directly over bottom source/drain region 210 proximate to a top surface of the substrate.

In various embodiments, formation of the bottom spacer layer 250 includes a directional deposition process such as high density plasma (HDP) deposition or gas cluster ion beam (GCIB) deposition to form the spacer material(s) over horizontal surfaces.

As used here, "horizontal" refers to a general direction along a primary surface of a substrate, and "vertical" is a direction generally orthogonal thereto. Furthermore, "vertical" and "horizontal" are generally perpendicular directions relative to one another independent of orientation of the substrate in three-dimensional space.

The thickness of the bottom spacer layer 250 may range from 4 to 10 nm, e.g., 4, 6, 8 or 10 nm, including ranges between any of the foregoing values. The bottom spacer layer 250 may comprise, for example, silicon dioxide ($SiO_2$). Alternatively, bottom spacer layer 250 may comprise other dielectric materials such as silicon nitride, silicon oxynitride, a low-k material, or any suitable combination of these materials.

Exemplary low-k materials include but are not limited to, amorphous carbon, fluorine-doped oxides, carbon-doped oxides, SiCOH or SiBCN. Commercially-available low-k dielectric products and materials include Dow Corning's SiLK™ and porous SiLK™ Applied Materials' Black Diamond™, Texas Instrument's Coral™ and TSMC's Black Diamond™ and Coral™. As used herein, a low-k material has a dielectric constant less than that of silicon dioxide. Bottom spacer layer 250 is adapted to isolate the bottom source/drain region 210 from a later-formed gate stack.

Figure 3B:
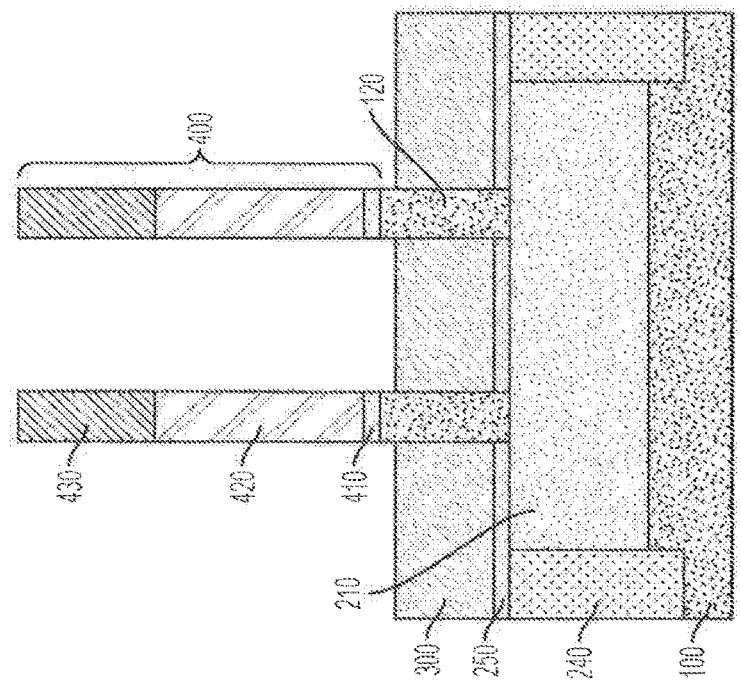
FIG. 3B shows the formation of a gate stack over sidewalls of the fins.
Figure 3A:
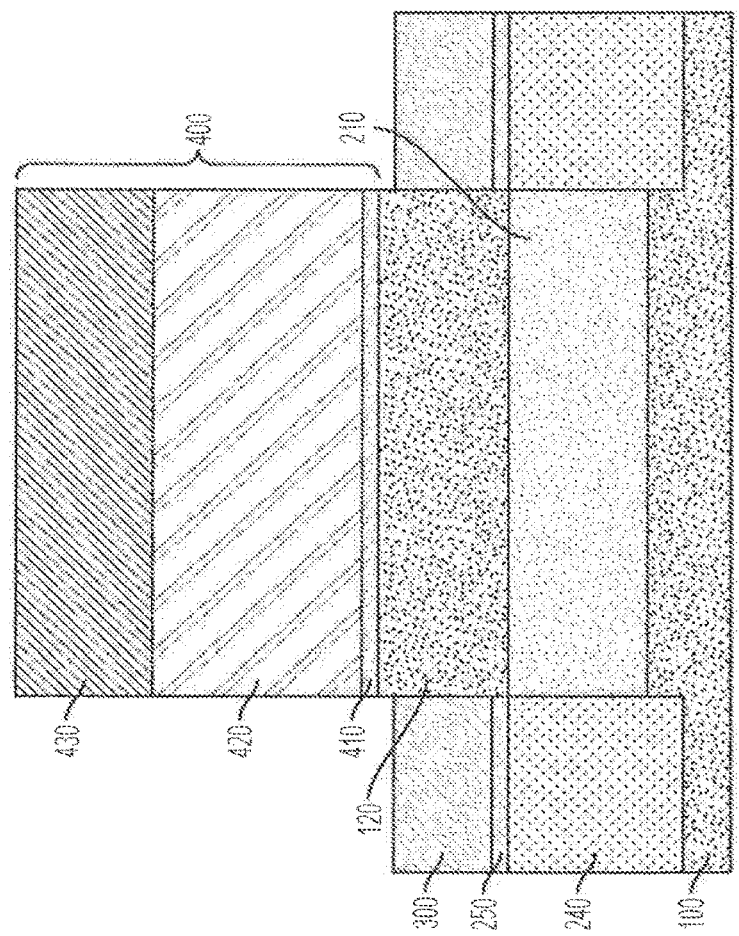
FIG. 3A shows the formation and recess etch of a gate stack over sidewalls of a fin.

Referring to FIGS. 3A and 3B, a gate stack 300 is formed above the bottom spacer 310 and over the sidewalls of the fins 120, i.e., over an intermediate portion of each fin. The gate stack 300 comprises a gate dielectric layer and one or more gate conductor layers, which are deposited in succession. For clarify, the individual layers of the gate stack 300 are not separately shown.

The gate dielectric may be a conformal layer that is formed over exposed surfaces of the fins 120, i.e., directly over the fin sidewalls, and over the bottom spacer 250. The gate dielectric may comprise silicon dioxide, silicon nitride, silicon oxynitride, a high-k dielectric, and/or other suitable material.

As used herein, a high-k material has a dielectric constant greater than that of silicon dioxide. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2.

The gate dielectric may be deposited by a suitable process such as atomic layer deposition (ALD), chemical vapor deposition (CVD), physical vapor deposition (PVD), thermal oxidation, UV-ozone oxidation, or combinations thereof. The gate dielectric thickness may range from 1 nm to 10 nm, e.g., 1, 2, 4, 6, 8 or 10 nm, including ranges between any of the foregoing values. In various embodiments, the gate dielectric includes a thin layer (e.g., 0.5 nm) of silicon oxide and an overlying layer of high-k dielectric material.

A gate conductor is formed over the gate dielectric. The gate conductor may include a conductive material such as polysilicon, silicon-germanium, a conductive metal such as Al, W, Cu, Ti, Ta, W, Pt, Ag, Au, Ru, Ir, Rh and Re, alloys of conductive metals, e.g., Al—Cu, silicides of one or more conductive metals, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof. The gate conductor may comprise one or more layers of such materials such as, for example, a metal stack including two or more of a barrier layer, work function layer, and conductive fill layer.

The gate conductor may be a conformal layer that is formed over exposed surfaces following deposition of the gate dielectric. The gate conductor can be formed utilizing a conventional deposition process such as, for example, ALD, CVD, metalorganic chemical vapor deposition (MOCVD), molecular beam epitaxy (MBE), PVD, sputtering, plating, evaporation, ion beam deposition, electron beam deposition, laser assisted deposition, or chemical solution deposition. The gate conductor thickness may range from 5 nm to 50 nm, e.g., 5, 10, 15, 20, 30, 40 or 50 nm, including ranges between any of the foregoing values.

As seen with reference to FIGS. 3A and 3B, following planarization of the gate stack 300, a recess etch removes the gate stack materials from over sidewalls of the composite hard mask 400. In the illustrated embodiment, the gate stack 300 is recessed to a height below a top surface of the fins 120. As used herein, a gate stack "height" or a fin "height" are measured in a direction normal to a major surface of the substrate. Prior to the recess etch, the gates stack 300 can be planarized, for example, by chemical mechanical polishing (CMP). Chemical mechanical polishing (CMP) is a material removal process that uses both chemical reactions and mechanical forces to remove material and planarize a surface.

Following the recess etch of the gate stack 300, a top spacer layer 270 is formed over sidewalls of the patterned hard mask 400, i.e., directly over exposed sidewalls of silicon dioxide layer 410, amorphous silicon layer 420, and silicon nitride layer 430. As shown in FIGS. 4A and 4B, the top spacer layer 270 is also formed directly over portions of the recessed gate stack 300 adjacent to the hard mask 400, and over upper sidewall portions of the fins 120. The methods and materials described above with reference to bottom spacer layer 250 may be used to form top spacer layer 270. The thickness of the top spacer layer 270 may range from 6 to 50 nm, e.g., 6, 10, 15, 20, 30, 40 or 50 nm, including ranges between any of the foregoing values.

Referring to FIGS. 5, 5A and 5B, using the top spacer layer 270 as an etch mask, the gate stack 300 is etched to define a self-aligned functional gate that wraps around each fin 120. A "functional gate" refers to a structure used to control output current (i.e., the flow of carriers through a channel) of a semiconductor device using an electrical field or, in some instances, a magnetic field. As seen with particular reference to FIG. 5A, an additional masking layer 280 may be used during the gate stack etch to define a gate contact location 310 for later-formed metallization. In the illustrated embodiment, masking layer 280 is formed over a portion of the gate stack 300 proximate to a distal end of the fin 120 and protects the portion of the gate metallization that will be used to provide a contact to the gate. Masking layer 280 may comprise an organic planarization layer (OPL), for example.

Figure 6B:
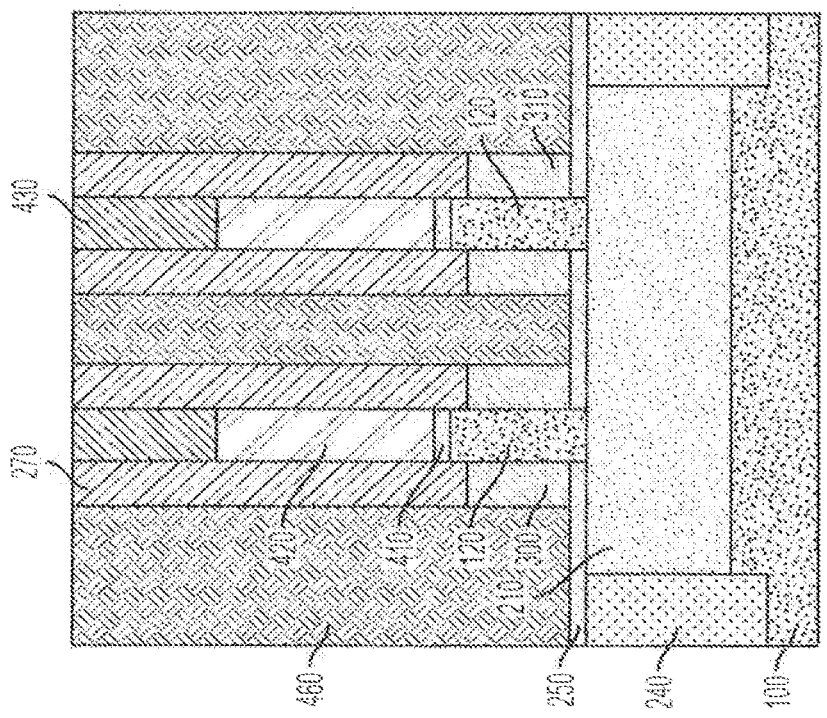
FIG. 6B is a cross-sectional view perpendicular to a pair of fins following deposition and planarization of an interlayer dielectric.

Referring to FIGS. 6A and 6B, following removal of the masking layer 280, an interlayer dielectric 460 is deposited over the structure to fill the openings between the fins 120. Interlayer dielectric 460 may comprise silicon dioxide or a combination of a thin silicon nitride liner followed by a fill layer of silicon dioxide, for example, which is/are deposited directly over bottom spacer layer 250, top spacer layer 270, and silicon nitride layer 430. A polishing step may be used to form a planarized structure. Silicon nitride layer 430 and top spacer layer 270 may function as a CMP stop during planarization.

Figure 7:
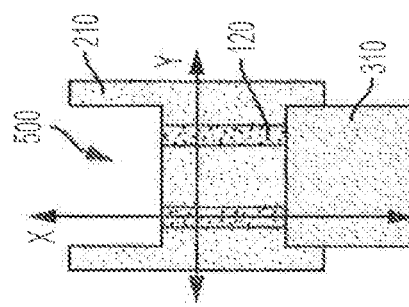
FIG. 7 shows the location of a fin cut laterally displaced from the gate contact location.
Figure 7A:
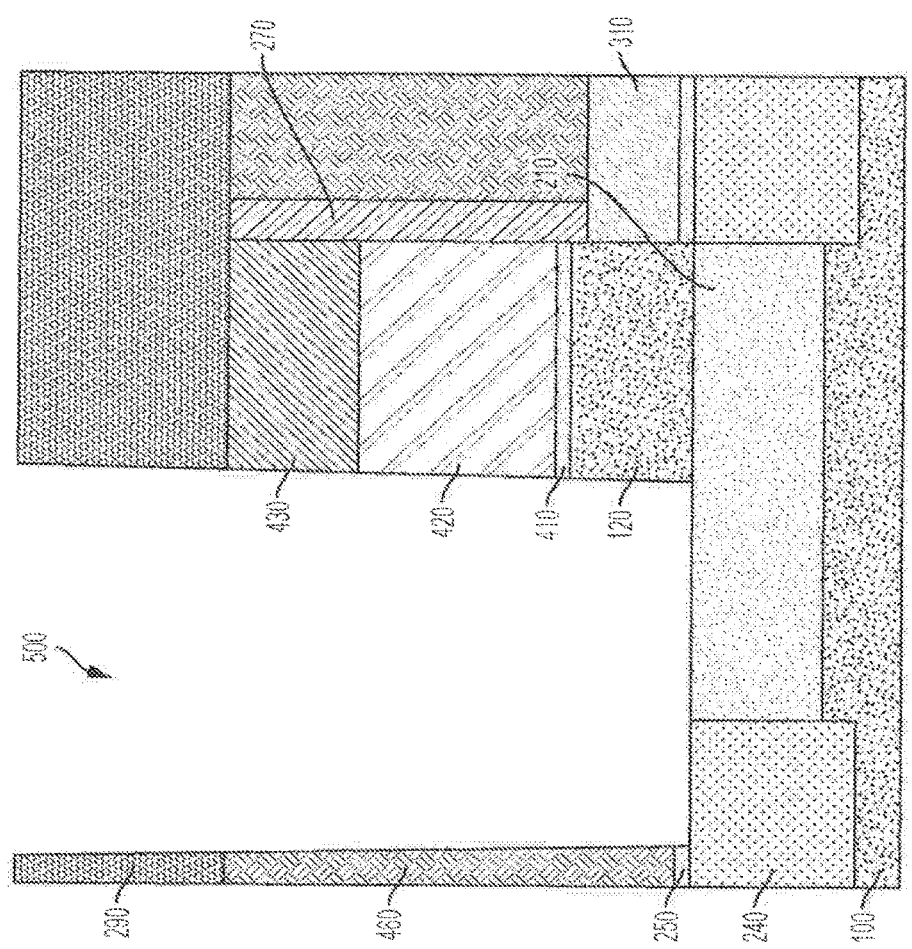
FIG. 7A shows an etching step to perform a fin cut and expose the bottom source/drain region and an endwall of the fin.
Figure 7B:
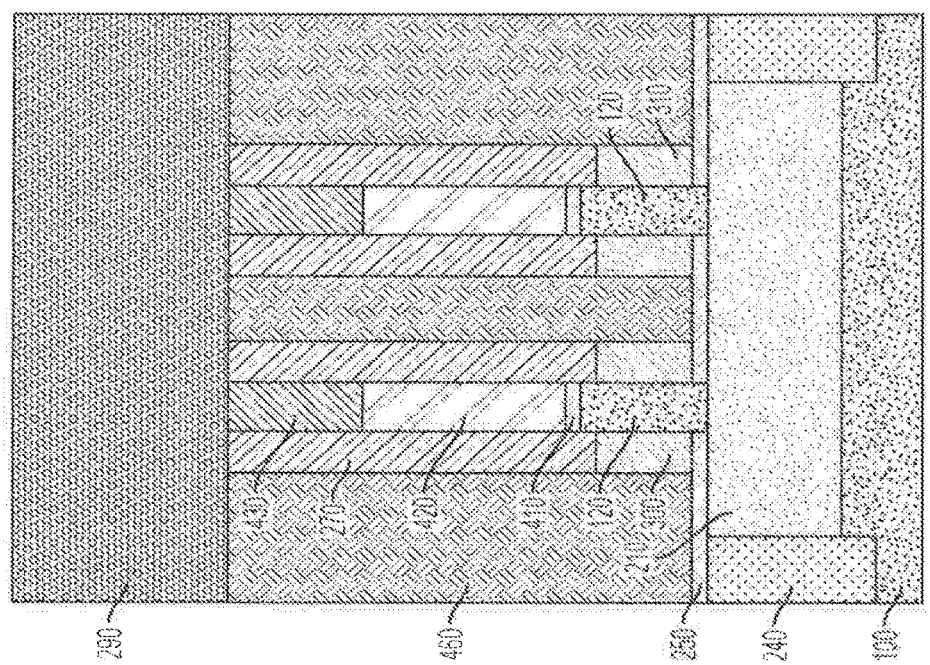
FIG. 7B is a cross-sectional view taken between the fin cut opening and the gate contact location.

FIGS. 7, 7A and 7B depict one embodiment of an intermediate structure, where multiple fins 120 are disposed over semiconductor substrate 100. Hard mask 400 is disposed over the top of each fin 120. As illustrated in FIGS. 7 and 7A, a fin cut or fin removal process is use to remove one or more unwanted fin portions from the intermediate structure. This is achieved in FIGS. 7A and 7B by providing a planarization material 290 over the fins. Using conventional photolithography, which may additionally employ an anti-reflective coating and a layer of photoresist (not shown), an opening 500 is patterned into the planarization material 290, and subsequently into the hard mask 400 to remove an end portion of fin 120. As shown, the removed portion of the fin 120 is located at an opposite end of the fin 120 from the gate contact location 310. The fin cut may remove 5 to 50% of a fin along its length, e.g., 5, 10, 15, 20, 30, 40 or 50%, including ranges between any of the foregoing values. During the fin cut, the gate stack 300 located laterally adjacent to the removed portion of the fin is also removed.

In one embodiment, the planarization material 290 may be an optical planarization layer (OPL) or optical dispersive layer (ODL), which blocks removal of portions of the fin that are to be retained. A selective etch may be used to remove the exposed hard mask 400, including silicon nitride layer 430, amorphous silicon layer 420, and silicon dioxide layer 410, the unwanted portion of the fin and laterally adjacent gate stack, and portions of the ILD 460. The fin etch may also remove the bottom spacer layer 250 within opening 500, exposing a top surface of the bottom source/drain region 210 and STI layer 240.

In various embodiments, the fin cut processing is selective, and can be integrated with existing FinFET device fabrication processing. The method includes providing a protective layer 290 over multiple fins on a substrate, patterning at least one opening 500 over at least one unwanted fin of the multiple fins, and removing at least a portion of the at least one unwanted fin exposed through the at least one opening 500. This removing includes removing at least a portion of the protective layer 290 over the at least one unwanted fin exposed through the at least one opening 500, and removing a portion of a previously-formed gate stack 300 disposed over portions of the removed fin 120.

The unwanted fin structure(s) may include a hard mask 400, where the protective layer 290 is formed over the hard mask 400. In various embodiments, the removing includes removing the hard mask 400 from the unwanted fin(s) exposed through the opening 500. Thus, during the process, the protective layer 290 protects the retained fin structures.

After selectively removing the unwanted fin portion(s), the protective layer 290 may be removed from over the remaining fin structure(s), and a sidewall spacer 520 formed within opening 500. Referring to FIG. 8A, sidewalls spacers 520 are disposed over sidewalls of the opening 500, i.e., over exposed surfaces of the ILD 460, silicon nitride layer 430, amorphous silicon layer 420, silicon dioxide layer 410, as well as over the cut fin 120. In certain embodiments, the sidewall spacer 520 is also formed directly over exposed surfaces of the gate stack 300, which is disposed over uncut sidewalls of the fin 120. Sidewall spacers 520 may be formed by blanket deposition of a spacer material followed by a directional etch such as reactive ion etching (RIE) to remove the spacer material from horizontal surfaces. Sidewall spacers 520 may be formed by chemical vapor deposition (CVD) or atomic layer deposition (ALD), for example.

Suitable sidewall materials include oxides, nitrides and oxynitrides, such as silicon dioxide, silicon nitride, silicon oxynitride, and low dielectric constant (low-k) materials such as amorphous carbon, SiOC, SiOCN and SiBCN, as well as a low-k dielectric material. In certain embodiments, the material for the sidewall spacer 520 is chosen to be etch selective with respect to silicon nitride layer 430. In certain embodiments, the sidewall spacer 520 thickness (l) is 4 to 20 nm, e.g., 4, 10, 15 or 20 nm, including ranges between any of the foregoing values.

Referring FIG. 9A, a conformal dielectric liner 530 is formed within opening 500, i.e., directly over sidewall spacers 520, and directly over the STI layer 240 and the bottom source drain region 210 at the bottom of the opening 500. By way of example, the dielectric liner 530 may comprise silicon nitride. Dielectric liner 530 may be formed by atomic layer deposition (ALD). The thickness of the dielectric liner 530 may range from 1 to 10 nm, e.g., 1, 2, 5 or 10 nm, including ranges between any of the foregoing values.

Referring to FIG. 10A, an interlayer dielectric (ILD) 550 is deposited to fill opening 500. Blanket deposition of the ILD 550 may be followed by a polishing step, e.g., chemical mechanical polishing, to remove the overburden. An example ILD layer 550 comprises silicon dioxide. Liner 530 may function as a CMP stop during planarization.

Optionally, the ILD layer 550 may be densified such as by steam annealing. During deposition of the interlayer dielectric 550, and during an optional densification anneal, liner 530 is adapted to protect the bottom source/drain region 210 from oxidation.

As will be appreciated, throughout the steps used to form sidewall spacer 520, liner 530, and ILD 550 as described with reference to FIGS. 8A-10A, the cross-fin structure viewed in FIGS. 8B-10B is essentially unchanged.

Referring to FIGS. 11A and 11B, an etching step is used to remove the silicon nitride layer 430 and expose a top surface of the amorphous silicon layer 420. During the etching step, the top spacer layer 270 is recessed such that a top surface of the top spacer layer 270 is substantially co-planar with a top surface of the amorphous silicon layer 420. FIG. 11A shows etching of the top spacer layer 430 to expose a top surface of the amorphous silicon layer 420. FIG. 11B is a transverse view showing a recess etch of the top spacer layer 430 over the fins 120.

After removing silicon nitride layer 430, a further etching step is used to remove the amorphous silicon layer 420 and the underlying silicon dioxide layer 410, as shown in FIGS. 12A and 12B. Removal of the amorphous silicon layer 420 and the underlying silicon dioxide layer 410 exposes a top surface of the fins 120.

Then, referring to FIGS. 13A and 13B, a top source/drain region 220 is formed over the fins 120, and a contact metallization layer 610 is formed over, i.e., in electrical contact with, the top source/drain region. The top source/drain region 220 may be formed using the methods and materials used to form the bottom source/drain region 210. Metallization layer 610 may comprise any suitable conductive material. For example, metallization layer 610 may comprise tungsten (W). A layer of tungsten or other suitable metallization layer may be formed using chemical vapor deposition. In various embodiments, the metallization layer 610 may include a bulk metal formed over a liner.

Following deposition of metallization layer 610, a CMP step can be used to remove the overburden and planarize the structure such that a top surface of the metallization layer 610 is substantially co-planar with each of the top surfaces of ILD layers 460 and 550.

Referring to FIGS. 14A and 14B, a recess etch may be used to recess the metallization layer 610 over the fins 120. In the illustrated embodiment, the metallization layer 610 is recessed below a top surface of the top spacer layer 270 to form contact recesses or trenches 612. In the illustrated example, the recesses 612 are self-aligned contact (SAC) recesses formed adjacent to (and overlapping) the top source/drain metallization layer 610 and top spacer layer 270.

Referring to FIGS. 15A and 15B, a self-aligned contact (SAC) capping layer 615, such as a silicon nitride layer, is formed within contact recesses 612, and the structure is planarized. As will be appreciated, the top spacer layer 270, sidewall spacer 520 and capping layer 615 cooperate to encapsulate the fin 120, top source/drain region 220, and top source/drain metallization layer 610, which enables the formation of a self-aligned contact to the bottom source/drain region 210 proximate to the cut endwall of the fin.

Referring to FIGS. 16A and 16B, a dielectric layer 600 is formed over the planarized structure of FIGS. 15A and 15B, and conventional lithography and etching techniques are used to pattern and define a self-aligned contact opening to the bottom source/drain region 210, which is backfilled with contact metallization 620. Contact metallization 620 is located proximate to the cut end of the fin 120, and is isolated from the fin, top source/drain region 220 and top source/drain metallization layer 610 by sidewall spacer 520, which has a thickness (l).

In the illustrated embodiment, the sidewall spacer 520 is formed directly over the cut endwall of fin 120, while the gate stack 300 is formed over the pair of adjacent fin sidewalls and over the opposing fin endwall. Sidewall spacer 520 is adapted to function as a barrier layer between bottom the source/drain contact metallization 620 and the active region of the device, which enables the contact metallization to be in close proximity to the fin.

Referring still to FIG. 16A, a top source/drain contact 630 extends through dielectric layer 600 and capping layer 615 to the recessed metallization layer 610, and a self-aligned gate contact 640 extends through dielectric layer 600 and interlayer dielectric 460 to gate 300. Bottom source/drain contact metallization 620, top source drain contact metallization 630 and gate metallization 640 may include a liner and a fill metal.

Referring to FIG. 17A, illustrated is a further embodiment where a portion of the gate metallization layer 300 is retained over the cut end of the fin 120 such that the sidewall spacer 520 is formed directly over the gate metallization layer 300. Such a structure may be formed in conjunction with a cut last approach, as described above, where formation of the gate stack 300 precedes the fin cut to define fin cut opening 500. Alternatively, a vertical FinFET device may be formed in conjunction with a cut first approach, where a fin cut etch precedes formation of the gate stack 300.

In the latter approach, the wrap-around gate stack 300 is formed over sidewalls of a cut fin, and the sidewall spacer 520 is formed over the gate stack at the cut end of the fin. Sidewall spacer 520 is adapted to function as a barrier between the fin and the later-formed bottom source/drain contact metallization. According to various embodiments, a thickness of any retained portion of the gate metallization layer 300, i.e., over the cut end of the fin, is less than a thickness of the gate metallization layer 300 disposed over other fin sidewalls.

Illustrated in FIGS. 2-17 are embodiments of a process to form a vertical field effect transistor, as well as the resulting structure, having improved cell height scaling. The method employs a fin cut before or after formation of a functional gate stack, and the subsequent creation of self-aligned contacts to achieve a higher cell density while avoiding unwanted parasitic capacitance or short circuits between neighboring conductive elements.

As used herein, the compounds silicon dioxide and silicon nitride have compositions that are nominally represented as $SiO_2$, and $Si_3N_4$, respectively. However, the terms silicon dioxide and silicon nitride refer to not only these stoichiometric compositions, but also to oxide and nitride compositions that deviate from the stoichiometric compositions.

As described herein, the formation or deposition of a layer or structure may involve one or more techniques suitable for the material or layer being deposited or the structure being formed. In addition to, or in lieu of various techniques cited above, such techniques include, but are not limited to, chemical vapor deposition (CVD), low-pressure chemical vapor deposition (LPCVD), plasma enhanced chemical vapor deposition (PECVD), metal organic CVD (MOCVD), atomic layer deposition (ALD), molecular beam epitaxy (MBE), electroplating, electroless plating, ion beam deposition, and physical vapor deposition (PVD) techniques such as sputtering or evaporation.

As used herein, the singular forms "a," "an" and "the" include plural referents unless the context clearly dictates otherwise. Thus, for example, reference to a "fin" includes examples having two or more such "fins" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a spacer layer that comprises silicon nitride include embodiments where a spacer layer consists essentially of silicon nitride and embodiments where a spacer layer consists of silicon nitride.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A vertical FinFET device, comprising:
   a fin disposed over a semiconductor substrate, the fin having vertical sidewalls, an endwall, and including an upper portion and a lower portion;
   a bottom source/drain region disposed over the semiconductor substrate, wherein the lower portion of the fin is in contact with the bottom source/drain region;
   a gate stack disposed alongside and in direct contact with a vertical sidewall of the fin, the gate stack extending laterally over the bottom source/drain region on at least one side of the fin,
   a top source/drain region disposed over the upper portion of the fin;
   a top source/drain metallization layer in electrical contact with the top source/drain region;
   a bottom source/drain metallization layer in electrical contact with the bottom source/drain region; and
   a sidewall spacer disposed over the endwall of the fin, wherein the sidewall spacer is disposed between the top source/drain metallization layer and the bottom source/drain metallization layer.

2. The vertical FinFET device of claim 1, wherein the sidewall spacer includes a first side and a second side opposite to the first side, and the top source/drain metallization layer is over the first side of the sidewall spacer and the bottom source/drain metallization layer is formed over the second side of the sidewall spacer.

3. The vertical FinFET device of claim 1, wherein the sidewall spacer is disposed directly over the endwall of the fin.

4. The vertical FinFET device of claim 1, wherein the sidewall spacer thickness is 4 to 20 nm.

5. The vertical FinFET device of claim 1, wherein the sidewall spacer is disposed over the entire endwall surface of the fin.

6. The vertical FinFET device of claim 1, wherein the sidewall spacer is disposed over exposed surfaces of the gate stack.

7. The vertical FinFET device of claim 1, wherein a distance between a sidewall of the bottom source/drain metallization layer and the endwall of the fin is 4 to 20 nm.

8. The vertical FinFET device of claim 1, further comprising a gate metallization layer in electrical contact with the gate stack.

9. The vertical FinFET device of claim 1, wherein the sidewall spacer comprises a material selected from the group consisting of silicon nitride, silicon oxynitride, SiOC, SiOCN and SiBCN.

10. The vertical FinFET device of claim 1, wherein the gate stack is positioned vertically beneath the top source/drain metallization layer, and horizontally distal to the bottom source/drain metallization layer.

11. A vertical FinFET device, comprising:
    a fin disposed over a semiconductor substrate;

a bottom source/drain region disposed over the semiconductor substrate, where a lower portion of the fin is in contact with the bottom source/drain region;

a gate stack disposed alongside and in direct contact with a vertical sidewall of the fin, positioned vertically beneath the top source/drain metallization layer, and horizontally distal to the bottom source/drain metallization layer, wherein the gate stack extends laterally over the bottom source/drain region on at least one side of the fin;

a top source/drain region disposed over an upper portion of the fin;

a top source/drain metallization layer in electrical contact with the top source/drain region, and formed over a first side of the sidewall spacer;

a bottom source/drain metallization layer in electrical contact with the bottom source/drain region, and formed over a second side of the sidewall spacer opposite to the first side; and a sidewall spacer disposed alongside and in direct contact with a vertical endwall of the fin, wherein the sidewall spacer is disposed between the top source/drain metallization layer and the bottom source/drain metallization layer.

12. The vertical FinFET device of claim 11, wherein the sidewall spacer thickness is 4 to 20 nm.

13. The vertical FinFET device of claim 11, wherein the sidewall spacer is disposed over an entire vertical endwall surface of the fin.

14. The vertical FinFET device of claim 11, wherein the sidewall spacer contacts a vertical sidewall surface of the gate stack.

15. The vertical FinFET device of claim 11, wherein a distance between a sidewall of the bottom source/drain metallization layer and the vertical endwall of the fin is 4 to 20 nm.

16. The vertical FinFET device of claim 11, further comprising a gate metallization layer in electrical contact with the gate stack.

17. The vertical FinFET device of claim 11, wherein the sidewall spacer comprises a material selected from the group consisting of silicon nitride, silicon oxynitride, SiOC, SiOCN and SiBCN.

* * * * *